US010784402B2

(12) United States Patent
Banna et al.

(10) Patent No.: US 10,784,402 B2
(45) Date of Patent: Sep. 22, 2020

(54) NANOWIRE FORMATION METHODS

(71) Applicant: GLOBALFOUNDRIES Inc., Grand Cayman (KY)

(72) Inventors: Srinivasa Banna, San Jose, CA (US); Deepak Nayak, Fremont, CA (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 16/366,811

(22) Filed: Mar. 27, 2019

(65) Prior Publication Data
US 2019/0221708 A1 Jul. 18, 2019

Related U.S. Application Data

(62) Division of application No. 15/704,982, filed on Sep. 14, 2017, now Pat. No. 10,290,768.

(51) Int. Cl.
H01L 29/06 (2006.01)
H01L 31/00 (2006.01)
(Continued)

(52) U.S. Cl.
CPC ............ *H01L 33/06* (2013.01); *H01L 25/167* (2013.01); *H01L 27/15* (2013.01); *H01L 27/156* (2013.01);
(Continued)

(58) Field of Classification Search
CPC ....... H01L 33/06; H01L 33/24; H01L 33/007; H01L 33/62; H01L 33/44; H01L 33/42;
(Continued)

(56) References Cited

U.S. PATENT DOCUMENTS 9,472,468 B2  10/2016 Van Dal et al.
9,608,160 B1   3/2017 Bayram et al.
(Continued)

OTHER PUBLICATIONS

Zhang et al. "High Brightness GaN-on-Si Based Blue LEDs Grown on 150 mm Si Substrates Using Thin Buffer Layer Technology", vol. 3, No. 6, Nov. 2015, retrieved from webpage http://ieeexplore.ieee.org/stamp/stamp.jsp?arnumber=7174951, pp. 457-462.
(Continued)

Primary Examiner — Ismail A Muse
(74) Attorney, Agent, or Firm — Ditthavong & Steiner, P.C.

(57) ABSTRACT

Methods of forming an integrated InGaN/GaN or AlInGaP/InGaP LED on Si CMOS for RGB colors and the resulting devices are provided. Embodiments include forming trenches having a v-shaped bottom through an oxide layer and a portion of a substrate; forming AlN or GaAs in the v-shaped bottom; forming a n-GaN or n-InGaP pillar on the AlN or GaAs through and above the first oxide layer; forming an InGaN/GaN MQW or AlInGaP/InGaP MQW over the n-GaN or n-InGaP pillar; forming a p-GaN or p-InGaP layer over the n-GaN pillar and InGaN/GaN MQW or the n-InGaP pillar and AlInGaP/InGaP MQW down to the first oxide layer; forming a TCO layer over the first oxide layer and the p-GaN or p-InGaP layer; forming a second oxide layer over the TCO layer; and forming a metal pad on the TCO layer above each n-GaN or n-InGaP pillar.

16 Claims, 18 Drawing Sheets

(51) Int. Cl.
*H01L 33/06* (2010.01)
*H01L 33/00* (2010.01)
*H01L 33/32* (2010.01)
*H01L 33/30* (2010.01)
*H01L 27/15* (2006.01)
*H01L 33/42* (2010.01)
*H01L 33/44* (2010.01)
*H01L 33/62* (2010.01)
*H01L 33/24* (2010.01)
*H01L 25/16* (2006.01)
*H01L 33/18* (2010.01)

(52) U.S. Cl.
CPC ........ *H01L 33/007* (2013.01); *H01L 33/0066* (2013.01); *H01L 33/0093* (2020.05); *H01L 33/18* (2013.01); *H01L 33/24* (2013.01); *H01L 33/30* (2013.01); *H01L 33/32* (2013.01); *H01L 33/42* (2013.01); *H01L 33/44* (2013.01); *H01L 33/62* (2013.01); *H01L 2933/0016* (2013.01); *H01L 2933/0025* (2013.01); *H01L 2933/0066* (2013.01)

(58) Field of Classification Search
CPC ..... H01L 33/0079; H01L 33/32; H01L 27/15; H01L 33/0066; H01L 33/30; H01L 2933/0025; H01L 2933/0016; H01L 2933/0066
See application file for complete search history.

(56) References Cited

U.S. PATENT DOCUMENTS

| | | |
|---|---|---|
| 2002/0117104 A1 | 8/2002 | Hata et al. |
| 2011/0114917 A1 | 5/2011 | Pan |
| 2012/0205617 A1 | 8/2012 | Pan et al. |
| 2012/0241809 A1 | 9/2012 | Pan et al. |
| 2015/0287790 A1 | 10/2015 | Bayram et al. |
| 2016/0240532 A1 | 8/2016 | Waldron et al. |
| 2016/0322536 A1 | 11/2016 | Dornel et al. |
| 2016/0365416 A1 | 12/2016 | Metz et al. |
| 2016/0365480 A1 | 12/2016 | Mi et al. |
| 2017/0077330 A1 | 3/2017 | Li et al. |
| 2017/0207307 A1 | 7/2017 | Dasgupta et al. |
| 2018/0151359 A1 | 5/2018 | Ko et al. |
| 2018/0175107 A1 | 6/2018 | Nayak et al. |
| 2019/0013440 A1 | 1/2019 | Chowdhury et al. |

OTHER PUBLICATIONS

Lin, "CEA LETI Looks into 3D GaN Nanowires for Ultra Bright LED Lighting", Oct. 21, 2016 retrieved from http://www.ledinside.com/news/2016/10/cea_leti_looks_into_3d_gan_nanowires_for_ultra_bright_led_lighting, pp. 1-3.

Dai et al. "Flexible Light-Emitting Diodes Based on Vertical Nitride Nanowires", Aug. 31, 2015, retrieved from webpage http://pubs.acs.org/doi/pdf/10.1021/acs.nanolett.5b02900, pp. 6958-6964.

Tchernycheva et al., "Core—shell InGaN/GaN nanowire light emitting diodes analyzed by electron beam induced current microscopy and cathodoluminescence mapping", Jan. 7, 2016, retrieved from webpage https://hal.archives-ouvertes.fr/hal-01252032/document, 17 pages.

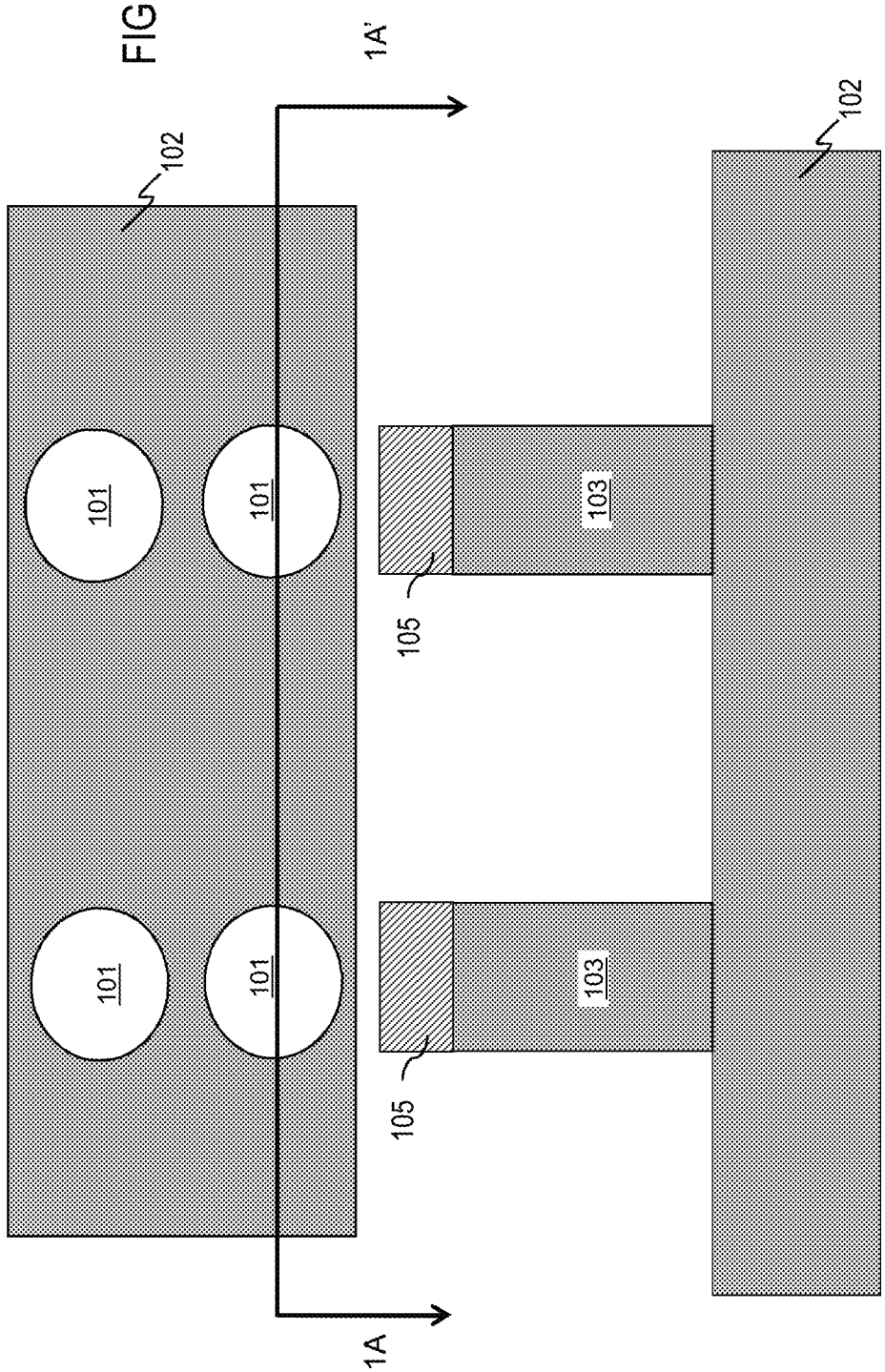

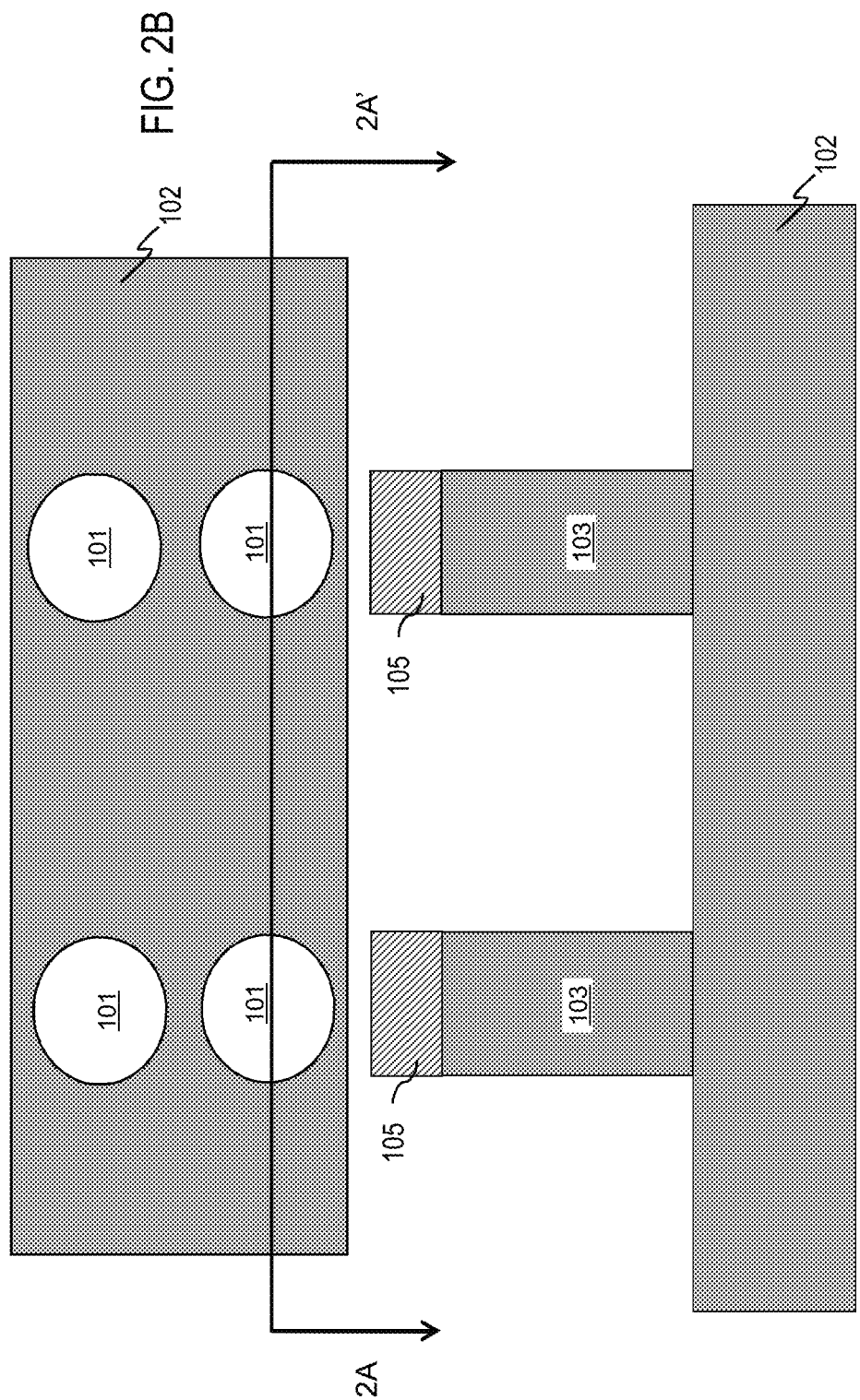

NANOWIRE FORMATION METHODS

RELATED APPLICATION

The present application is a Divisional application of U.S. application Ser. No. 15/704,982, filed Sep. 14, 2017, which is incorporated herein by reference in its entirety.

TECHNICAL FIELD

The present disclosure relates to light emitting diodes (LEDs). The present disclosure is particularly applicable to semiconductor-based LEDs.

BACKGROUND

Gallium nitride (GaN) growth on silicon (Si) complementary metal-oxide-semiconductor (CMOS) wafers are highly desirable for producing low power and high brightness micro displays for use in various applications, e.g., augmented reality (AR), virtual reality (VR), and video projection. Known approaches typically involve epitaxially growing GaN on Si (111) CMOS wafers using 3 micrometer (μm) to 8 μm thick buffer layers with intermediate layers to manage lattice constant and coefficient of thermal expansion (CTE) mismatch between materials. However, Si wafers are susceptible to bending because thick buffer layers strains the Si wafers during subsequent processing.

A need therefore exists for methodology enabling GaN or indium gallium phosphide (InGaP) selective area growth without thick buffer layers preventing bending of Si wafers.

SUMMARY

An aspect of the present disclosure is a method of forming an indium gallium nitride (InGaN)/GaN or aluminum indium gallium phosphide (AlInGaP)/indium gallium phosphide (InGaP) LED on a Si CMOS driver wafer.

Another aspect of the present disclosure is device with an InGaN/GaN or AlInGaP/InGaP LED on a Si CMOS driver wafer.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a plurality of trenches through a first oxide layer and a portion of a Si substrate, each trench having a v-shaped bottom; forming aluminum nitride (AlN) or gallium arsenide (GaAs) in the v-shaped bottom; forming a n-type GaN (n-GaN) or InGaP (n-InGaP) pillar on the AlN or GaAs, respectively, through and above the first oxide layer; forming an InGaN and GaN or AlInGaP and InGaP multiple quantum well (MQW) (InGaN/GaN MQW or AlInGaP/InGaP MQW) over the n-GaN or n-InGaP pillar, respectively; forming a p-type GaN (p-GaN) or InGaP (p-InGaP) layer over the n-GaN pillar and InGaN/GaN MQW or the n-InGaP pillar and AlInGaP/InGaP MQW, respectively, down to the first oxide layer; forming a transparent conductive oxide (TCO) layer over the first oxide layer and the p-GaN or p-InGaP layer; forming a second oxide layer over the TCO layer; and forming a metal pad on the TCO layer above each n-GaN or n-InGaP pillar.

Aspects of the present disclosure include forming each trench by: forming a nitride layer over the Si substrate; patterning the nitride layer and the Si substrate to form plurality of Si fins or nanowires over the Si substrate; forming the first oxide layer over the Si substrate; planarizing the first oxide layer down to the nitride layer; and etching the nitride layer, plurality of Si fins or nanowires, and a portion of the Si substrate with tetramethylammonium hydroxide (TMAH), forming the plurality of trenches. Further aspects include forming each Si fin or nanowire having a width or diameter of 50 nanometer (nm) to 600 nm. Another aspect includes etching the portion of the Si substrate to a depth of 150 nm to 300 nm. Additional aspects include forming the AN or GaAs, each n-GaN or n-InGaP pillar, InGaN/GaN or AlInGaP/InGaP MQW, and p-GaN or p-InGaP, respectively, by metalorganic chemical vapor deposition (MOCVD) or molecular beam epitaxy (MBE). Further aspects include forming an InGaN/GaN MQW or an AlInGaP/InGaP MQW over the n-GaN or n-InGaP pillar prior to forming the p-GaN or p-InGaP layer, respectively. Additional aspects include removing the Si substrate, the AlN or GaAs, and a portion of the first oxide layer and n-GaN or n-InGaP pillars, respectively; forming a second TCO layer over a remaining portion of the first oxide layer and n-GaN or n-InGaP pillars; and connecting each metal pad to a Si CMOS wafer. Further aspects include the remaining portion having at least a thickness of 0.5 μm to 1 μm.

Another aspect of the present disclosure is a device including: a Si CMOS wafer having a plurality of metal contacts laterally separated; a metal pad electrically connected to each metal contact; a t-shaped oxide structure over the Si CMOS wafer adjacent to and between each metal pad; a conformal first TCO layer over the Si CMOS wafer, a u-shaped cavity above each metal pad; a p-GaN layer along sidewalls and a bottom of each u-shaped cavity; an InGaN/GaN MQW along each sidewall of the p-GaN layer; an n-GaN pillar between the InGaN/GaN MQWs over the p-GaN layer, above each metal pad; an oxide layer over the Si CMOS wafer; and a second TCO layer over the oxide layer and each n-GaN pillar.

Aspects of the device include an InGaN/GaN MQW between the p-GaN layer and a bottom of the n-GaN pillar. Another aspect includes an upper surface of the first TCO layer, the p-GaN layer, and each InGaN/GaN MQW are coplanar. Other aspects include the oxide layer having a thickness of at least 0.5 μm to 1 μm. A further aspect includes the n-GaN pillar having a hexagonal shape between the InGaN/GaN MQWs and a cylindrical shape within the oxide layer. Additional aspects include the n-GaN pillar including a blue or green LED.

A further aspect of the present disclosure is a device including: a Si CMOS wafer having a plurality of metal contacts laterally separated; a metal pad electrically connected to each metal contact; a t-shaped oxide structure over the Si CMOS wafer adjacent to and between each metal pad; a conformal first TCO layer over the Si CMOS wafer, a u-shaped cavity above each metal pad; a p-type InGaP (p-InGaP) layer along sidewalls and a bottom of each u-shaped cavity; an AlInGaP/InGap MQW along each sidewall of the p-InGaP layer; a n-type InGaP pillar between the AlInGaP/InGaP MQWs over the p-InGaP layer, above each metal pad; an oxide layer over the Si CMOS wafer; and a second TCO layer over the second oxide layer and each n-InGaP pillar.

Aspects of the present disclosure include an AlInGaP/InGaP MQW between the p-InGaP layer and a bottom of the n-InGaP pillar. Another aspect includes an upper surface of the first TCO layer, p-InGaP layer, and each AlInGaP/InGaP MQW are coplanar. A further aspect includes the oxide layer having a thickness of at least 0.5 µm to 1 µm. Additional aspects include the n-InGaP pillar having a hexagonal shape between the AlInGaP/InGaP MQWs and a cylindrical shape within the oxide layer. A further aspect includes the n-InGaP pillar including a red LED.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A and 1C through 1J schematically illustrate cross-sectional views of a process flow for forming a InGaN/GaN LED on a Si CMOS driver wafer, in accordance with an exemplary embodiment;

FIG. 1B schematically illustrates a top view of a photomask utilized during a photolithography process;

FIGS. 2A and 2C through 2J schematically illustrate cross-sectional views of a process flow for forming an AlInGaP/InGaP LED on Si CMOS driver wafer, in accordance with an exemplary embodiment; and FIG. 2B schematically illustrates a top view of a photomask utilized during a photolithography process.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of thick buffer layers, bending of Si wafers during subsequent processing, lattice constant and CTE mismatch between material systems, and high costs attendant upon integrating InGaN/GaN or AlInGaP/InGaP LEDs on the same CMOS driver wafer. The problems are solved, inter alia, by creating Si nanowire (NW) of desirable diameters and replacing the Si NW with selective growth of GaN or InGaP pillars.

Methodology in accordance with embodiments of the present disclosure includes forming a plurality of trenches through a first oxide layer and a portion of a Si substrate, each trench having a v-shaped bottom. An AlN or GaAs is formed in the v-shaped bottom. An n-GaN or n-InGaP pillar is formed on the AlN or GaAs, respectively, through and above the first oxide layer. An InGaN/GaN MQW or AlInGaP/InGaP MQW is formed over the n-GaN or n-InGaP pillar, respectively. A p-GaN or p-InGaP layer is formed over the n-GaN pillar and InGaN/GaN MQW or the n-InGaP pillar and AlInGaP/InGaP MQW, respectively, down to the first oxide layer. A TCO layer is formed over the first oxide layer and the p-GaN or p-InGaP layer. A second oxide layer is formed over the TCO layer and a metal pad is formed on the TCO layer above each n-GaN or n-InGaP pillar.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1C:
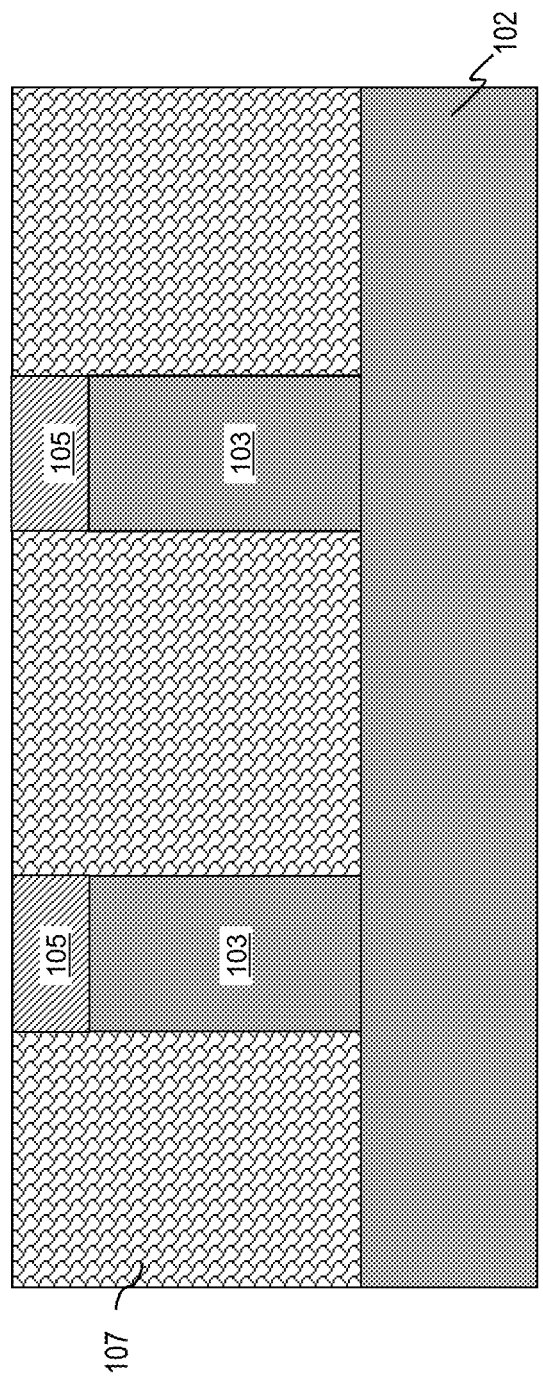
Figure 1D:
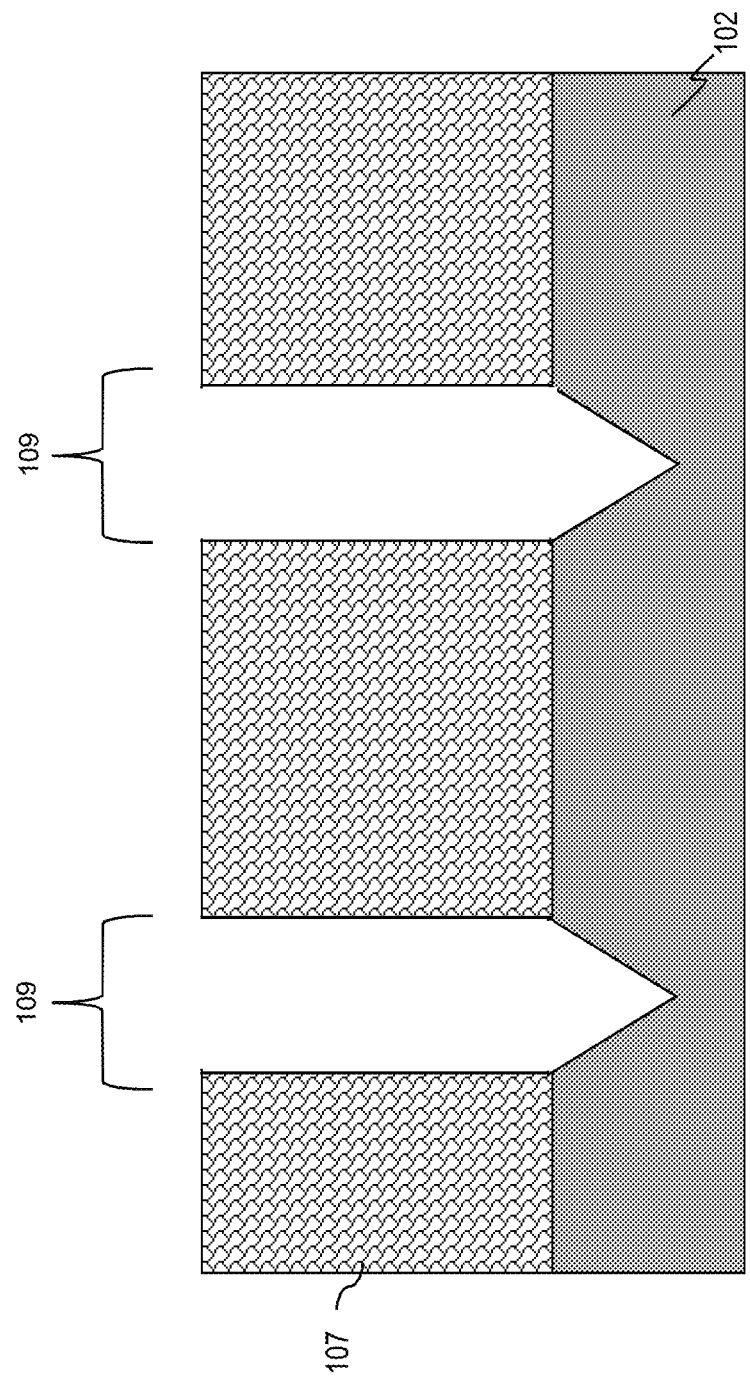
Figure 1E:
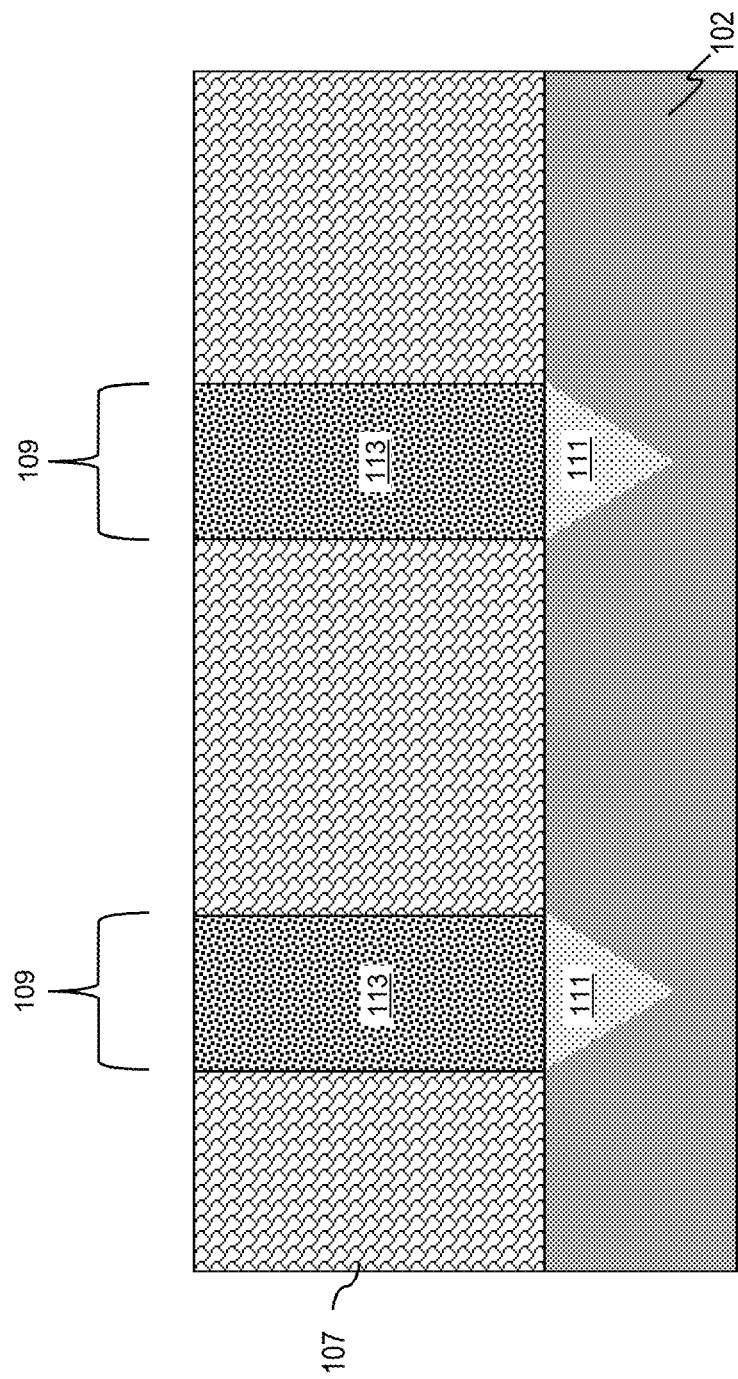
Figure 1F:
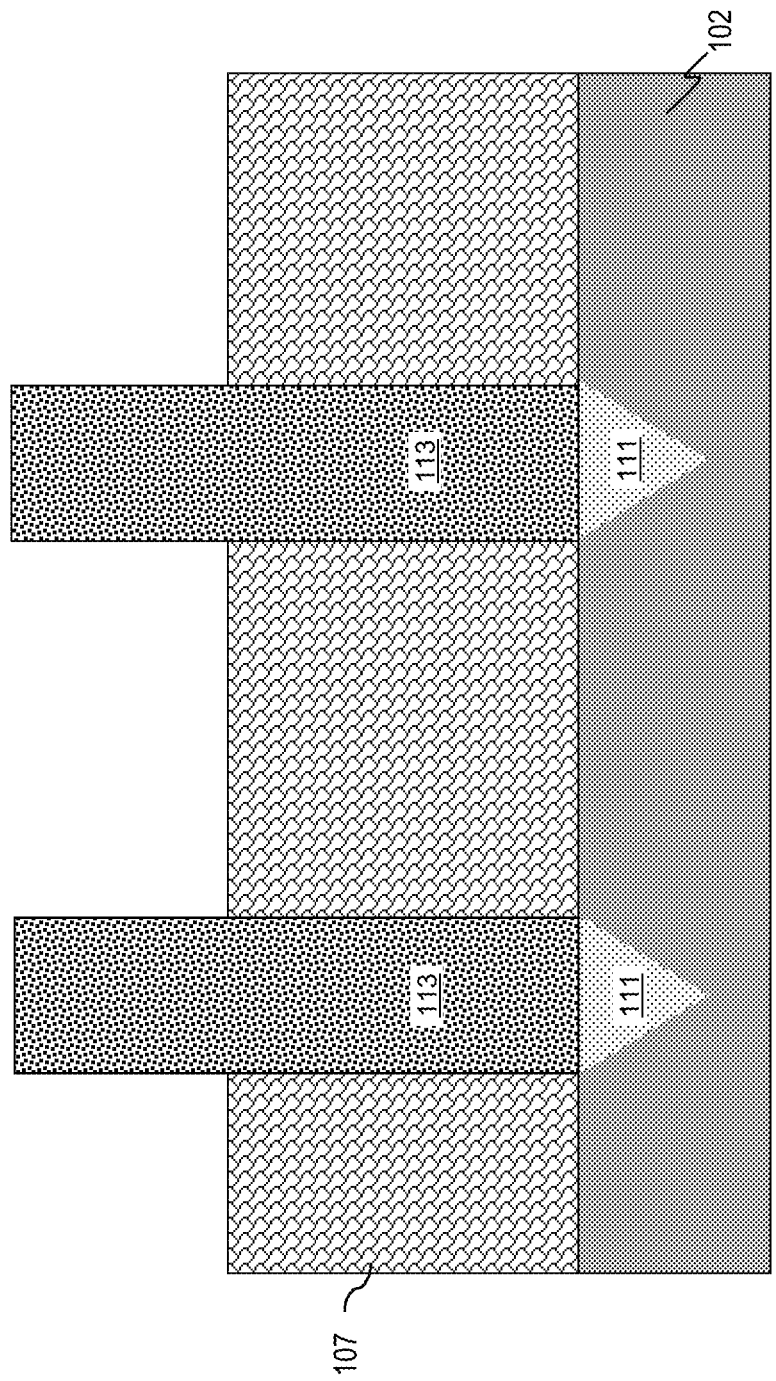

FIGS. 1A and 1C through 1J schematically illustrate cross-sectional views of a process flow for forming an InGaN/GaN LED on a Si CMOS driver wafer along the line 1A-1A' of FIG. 1B, in accordance with an exemplary embodiment. Adverting to FIG. 1A, a nitride layer (not shown for illustrative convenience) is conformally formed over a Si substrate 102. Next, a photolithography process (not shown for illustrative convenience) is utilized to pattern the nitride layer and the Si substrate 102. A photomask with features 101, e.g., with a diameter of 50 nm to 600 nm and a pitch of 300 nm to 1400 nm, may be used to mask areas of the nitride layer and the Si substrate 102 that are to be blocked from a light beam during the photolithography process, as depicted in FIG. 1B. Consequently, the nitride layer and Si substrate 102 are etched to a certain depth forming Si fins or nanowires 103 and nitride layer 105. An oxide layer 107 is formed, e.g., to a thickness of 200 nm to 1000 nm, over the Si substrate 102, Si fins or nanowires 103 and nitride layer 105 and then planarized by chemical mechanical polishing (CMP) down to the nitride layer 105 forming oxide layer 107, as depicted in FIG. 1C. Adverting to FIG. 1D, the nitride layer 105 and Si fins or nanowires 103 are removed, respectively. Then, portions of the Si substrate 102 are etched by TMAH forming trenches 109 having v-shaped bottom (e.g., V-groove). Each v-shaped bottom has a depth, e.g., of 150 nm to 300 nm, and a top diameter, e.g., of 192 nm to 384 nm. As illustrated in FIG. 1E, AN 111 is grown, e.g., to a thickness of 150 nm to 300 nm, in the v-shaped bottom of trenches 109 by MOCVD. Although the AN 111 is depicted as being coplanar with the substrate 102 in FIG. 1E, the AN 111 may also be grown slightly above the substrate 102. Next, n-GaN pillars 113 are formed on the AN 111 through and above the oxide layer 107 by MOCVD, as depicted in FIGS. 1E and 1F. The n-GaN pillars 113 formed within the oxide layer 107 is cylindrical in shape as defined by the shape of the trenches 109. Adverting to FIG. 1F, the n-GaN pillars 113 is ultimately formed to a height, e.g., of 500 nm to 5000 nm and the portion of the n-GaN pillars 113 above the oxide layer 107 has a hexagonal structure because there is no constraint on the shape of the structure. The n-GaN pillars 113 may be a blue or a green LED.

Figure 1G:
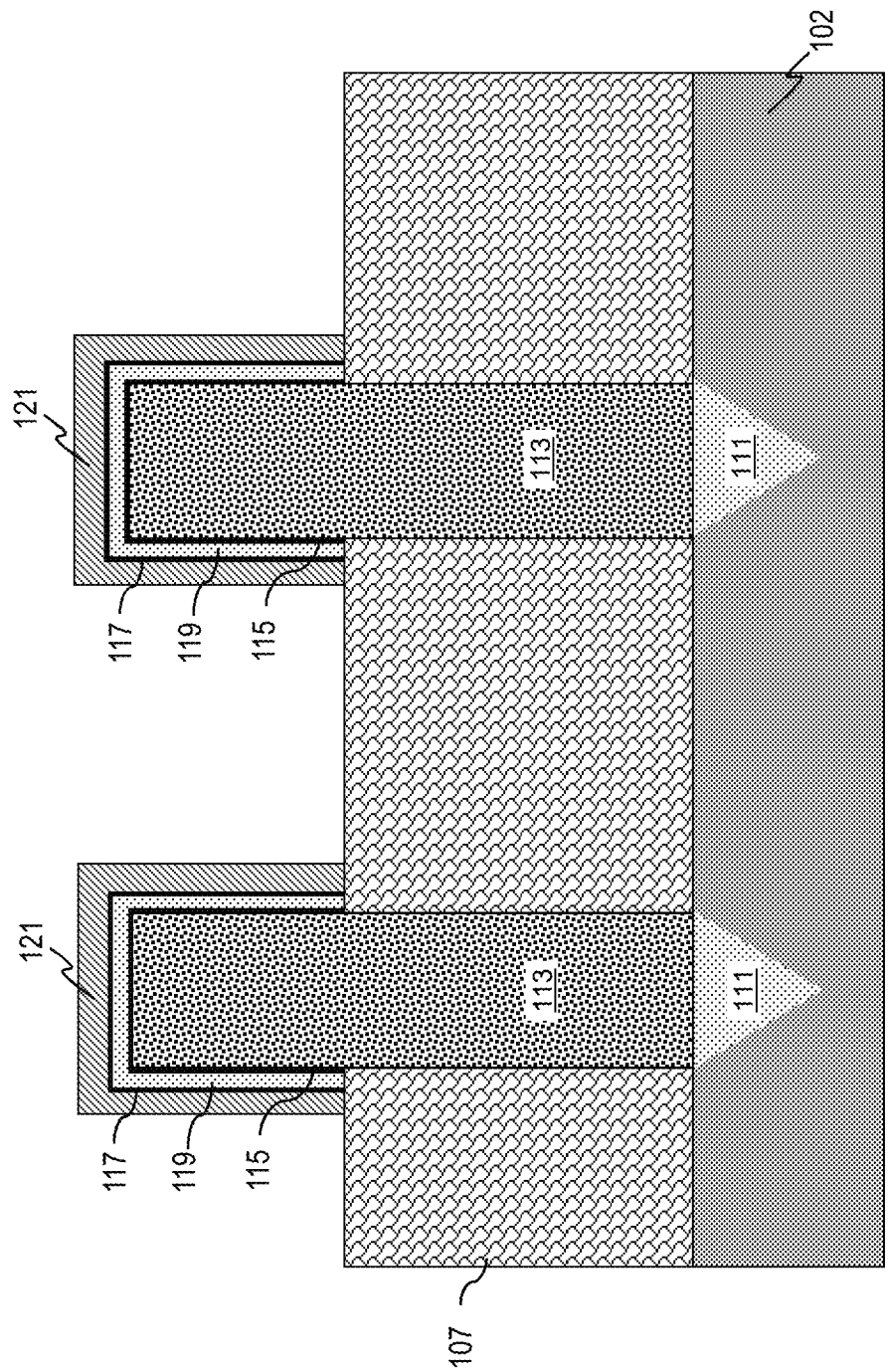
Figure 1H:
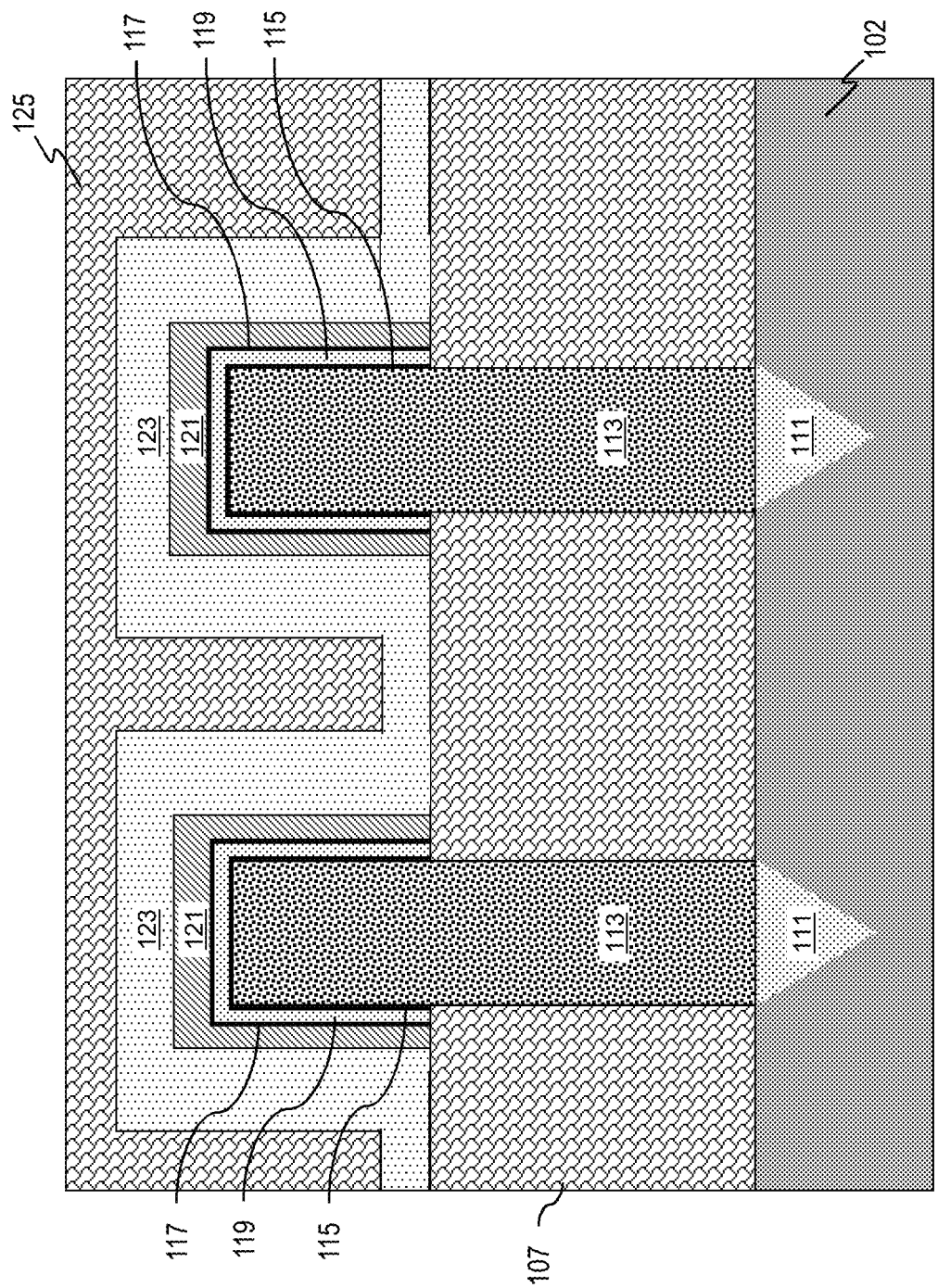

Adverting to FIG. 1G, an InGaN/GaN MQW formed of InGaN layers 115 and 117 and a GaN layer 119 therebetween is formed over each n-GaN pillars 113 by MOCVD. The InGaN layers 115 and 117 may be formed, e.g., to a thickness of 2 nm to 5 nm, and the GaN layer 119 may be formed, e.g., to a thickness of 8 nm to 15 nm. A p-GaN layer 121 is then formed, e.g., to a thickness of 100 nm to 250 nm, over each InGaN/GaN MQW down to the oxide layer 107 by MOCVD. An electron blocking layer (not shown for illustrative convenience) may be formed, e.g., of AlGaN, to a thickness, e.g., of 3 nm, before forming the p-GaN layer 121. Next, a conformal electrically conductive metal or TCO layer 123 is formed, e.g., to a thickness of 100 nm to 250 nm, over the oxide layer 107 and the p-GaN layer 121, as depicted in FIG. 1H. An oxide layer 125 is then formed over the TCO layer 123.

Figure 1I:
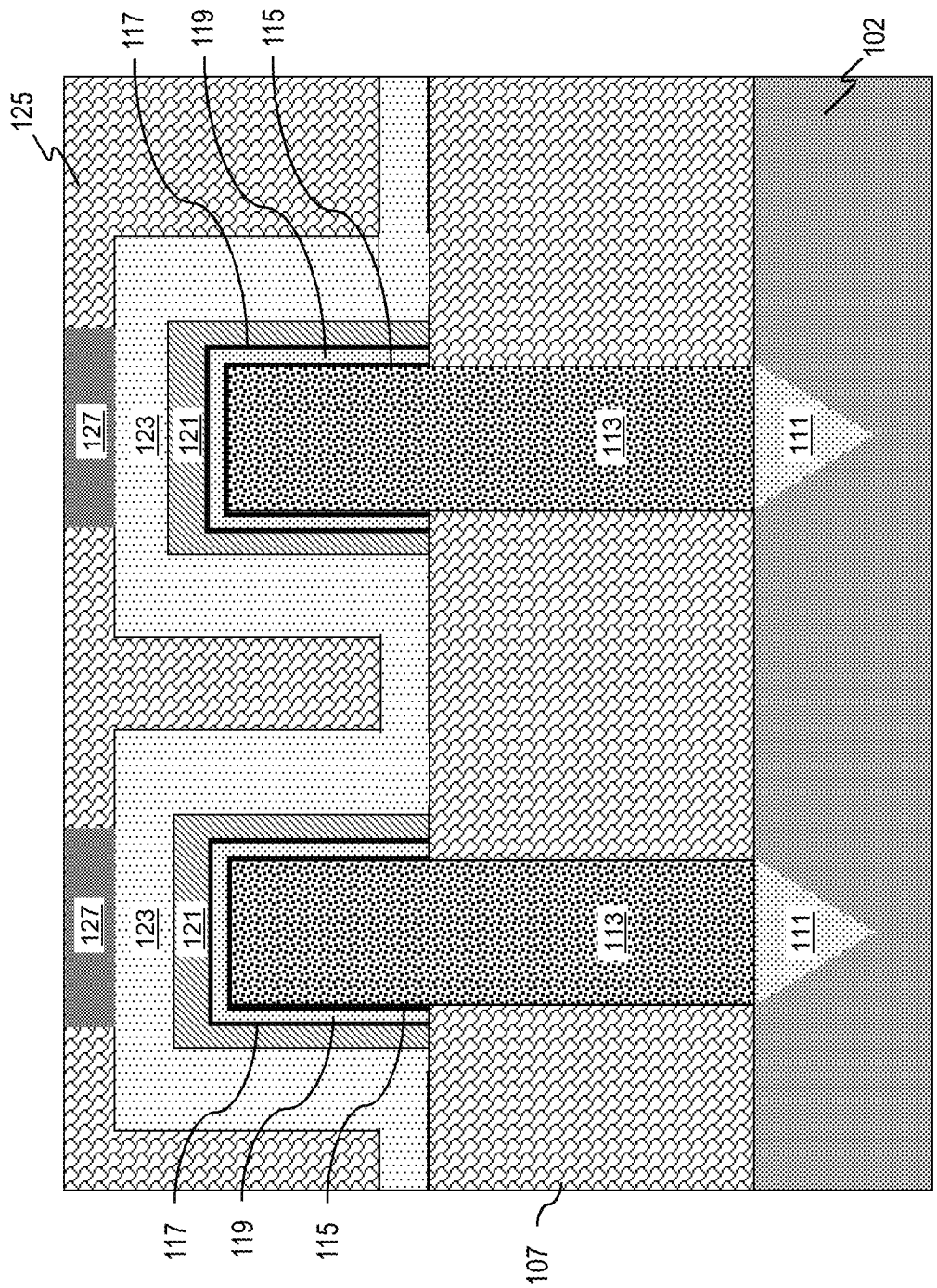
Figure 1J:
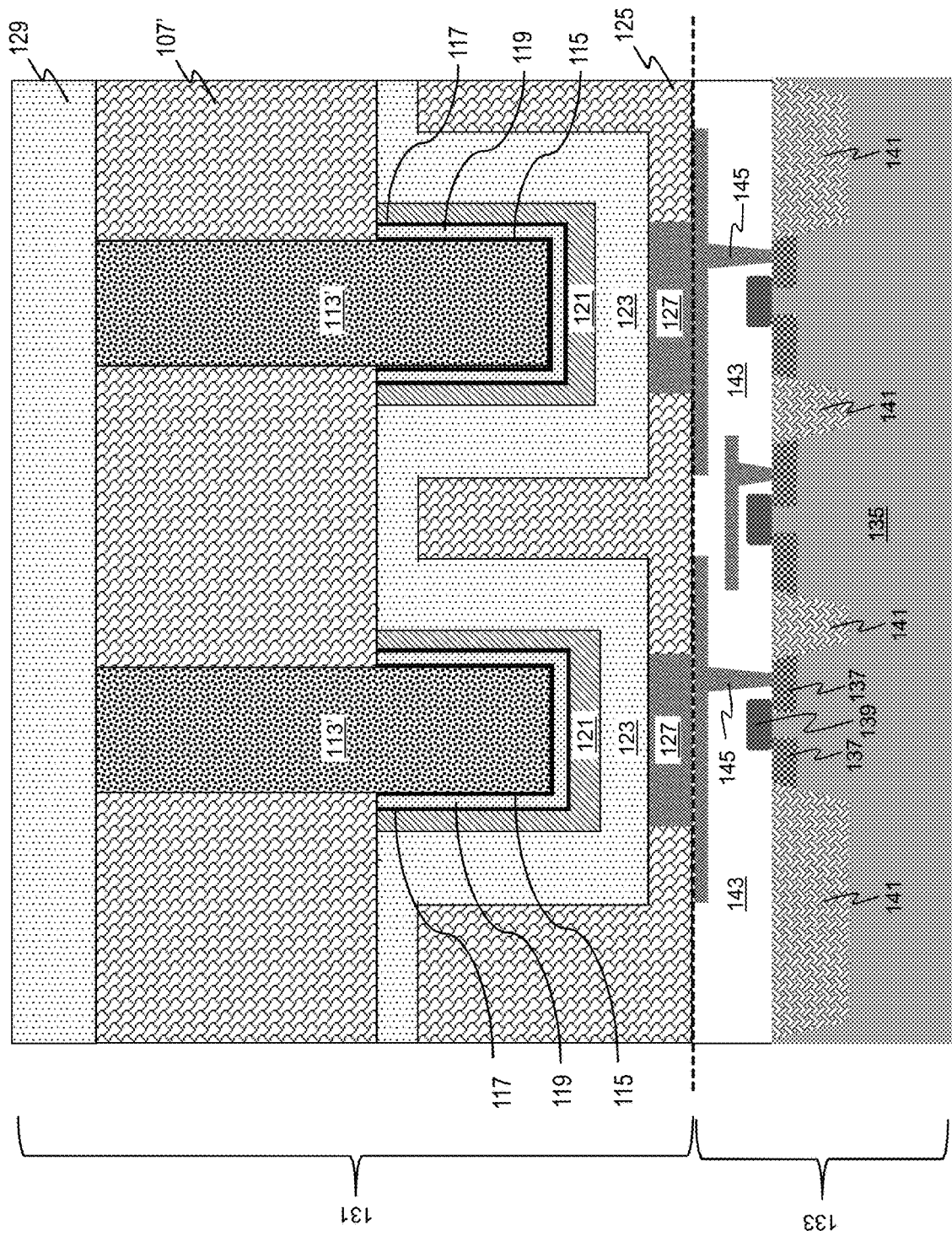

Next, trenches (not shown for illustrative convenience) are formed through the oxide layer 125 down to the electrically conductive metal or TCO layer 123 above each n-GaN pillars 113 and the trenches are filled with a metal, e.g., titanium (Ti), aluminum (Al) or nickel (Ni), and then planarized, e.g., by CMP, down to the oxide layer 125, forming metal pads 127, as depicted in FIG. 1I. As illustrated in FIG. 1J, structure 131 (LED wafer) is flipped and bonded to Si-CMOS wafer 133. Next, Si substrate 102, the AlN 111, and portions of the oxide layer 107 and n-GaN pillars 113 are removed, forming the oxide layer 107' and n-GaN pillars 113'. The remaining oxide layer 107' and n-GaN pillars 113' have a thickness of at least 0.5 µm to 1 µm. Next, a TCO layer 129 is formed over the structure 131. Next, each metal pad 127 in structure 131 is connected to a Si CMOS wafer 133 that includes a substrate 135, source/drain (S/D) regions 137, gates 139, shallow trench isolation (STI) structures 141, an oxide layer 143, and metal contacts 145. The CMOS wafer 133 applies bias to structure 131 and ground on the TCO layer 129 for lighting the blue or green LEDs.

Figure 2C:
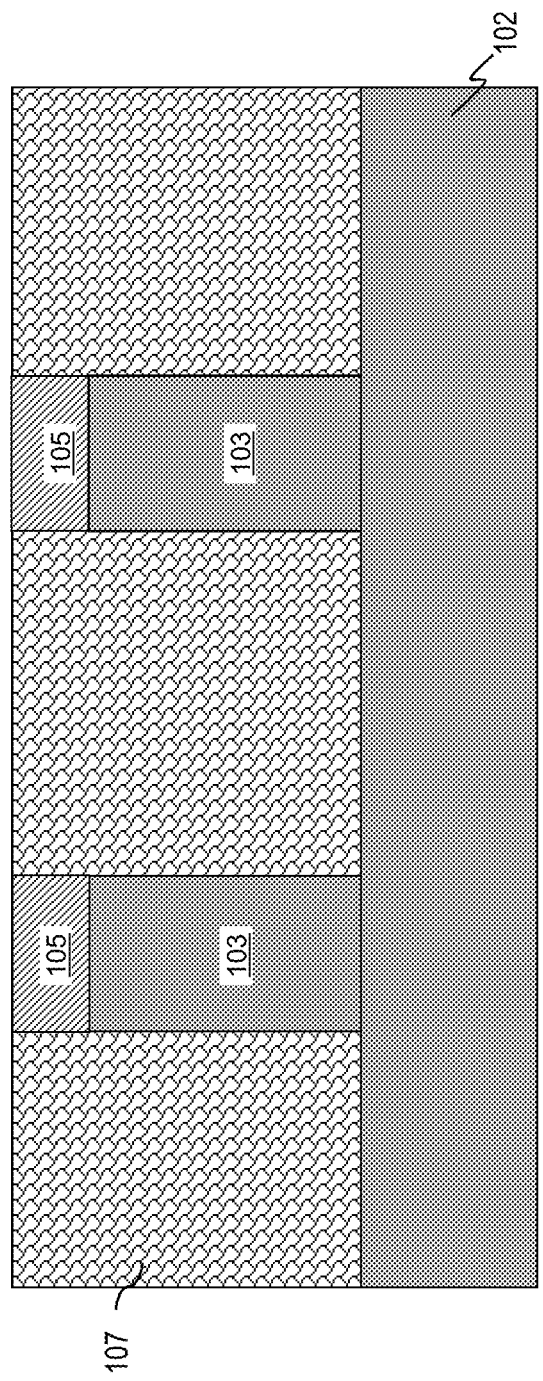
Figure 2D:
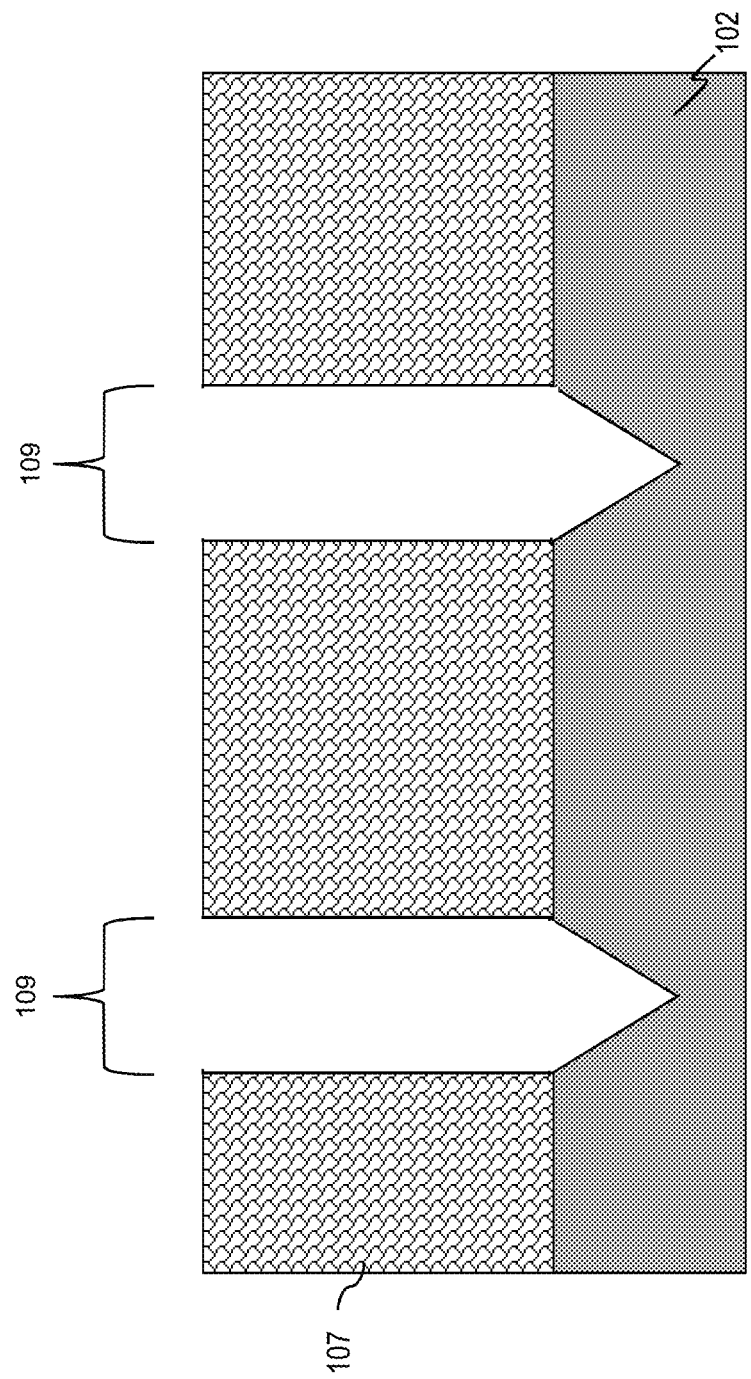
Figure 2E:
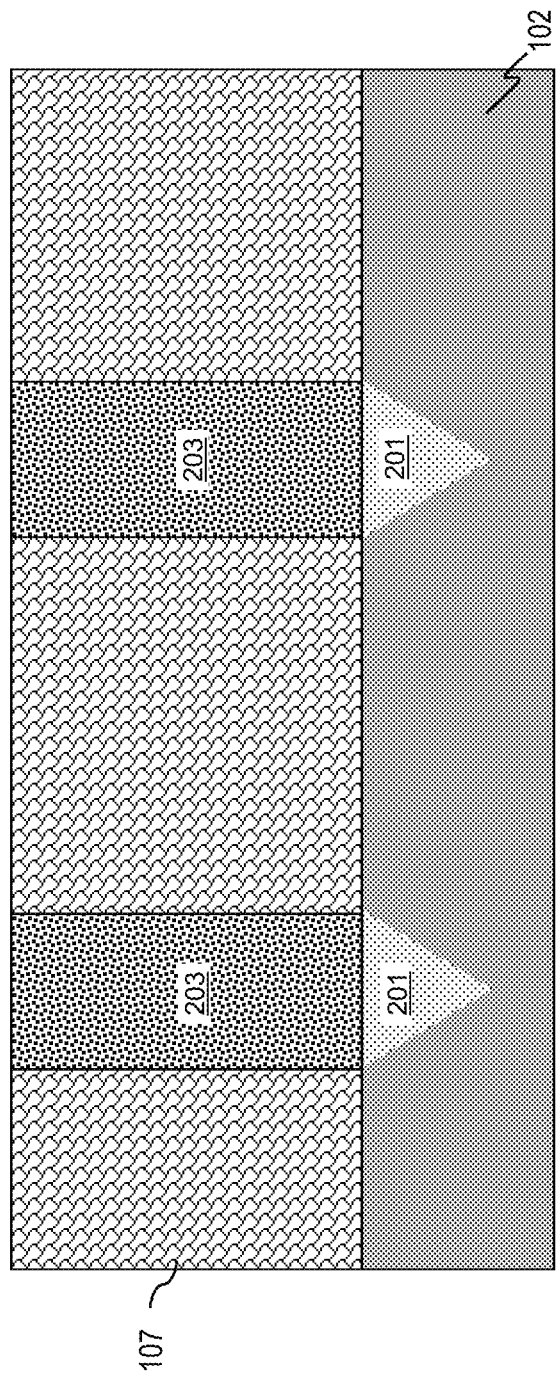
Figure 2F:
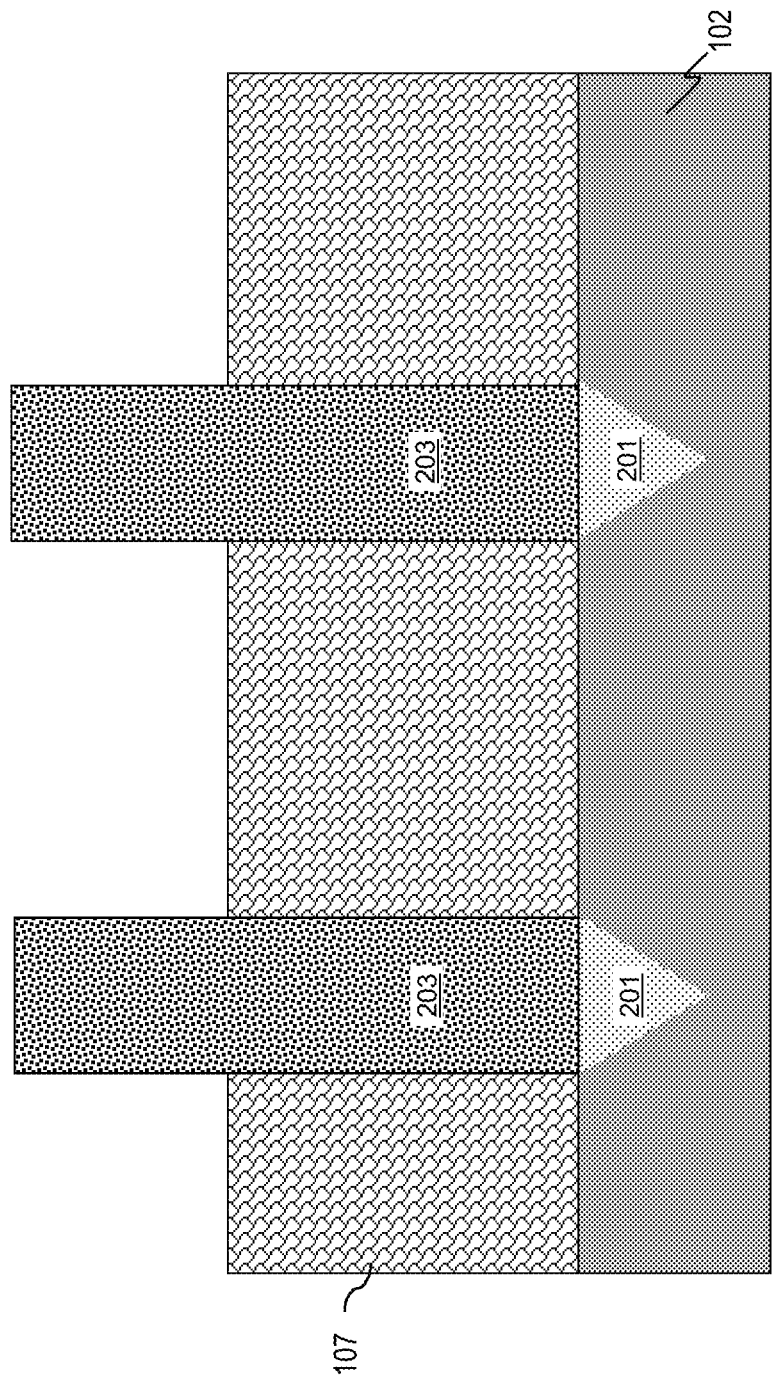

FIGS. 2A and 2C through 2J schematically illustrate cross-sectional views of a process flow for forming an AlInGaP/InGaP LED on Si CMOS driver wafer along the line 2A-2A' of 2B, in accordance with an exemplary embodiment. The process steps of FIGS. 2A through 2D are identical to the process steps of FIGS. 1A and 1D. Adverting to FIG. 2E, once the trenches 109 of FIG. 2D have been formed, GaAs 201 is grown, e.g., to a thickness of 150 nm to 300 nm, in the v-shaped bottom by MOCVD. Similar to FIG. 1E, although the GaAs 201 is depicted as being coplanar with the substrate 102 in FIG. 2E, the GaAs 201 may also be grown slightly above the substrate 102. Next, n-InGaP pillars 203 are formed on the GaAs 201 through and above the oxide layer 107 by MOCVD, as depicted in FIGS. 2E and 2F. The n-InGaP pillars 203 formed within the oxide layer 107 is cylindrical structure as defined by the shape of the trenches 109. Adverting to FIG. 2F, the n-InGaP pillars 203 is formed to a height, e.g., of 500 nm to 5000 nm and the portion of the n-InGaP pillars 203 has a hexagonal structure because there is no constraint on the shape of the structure. The n-InGaP pillars 203 may be a red LED.

Figure 2G:
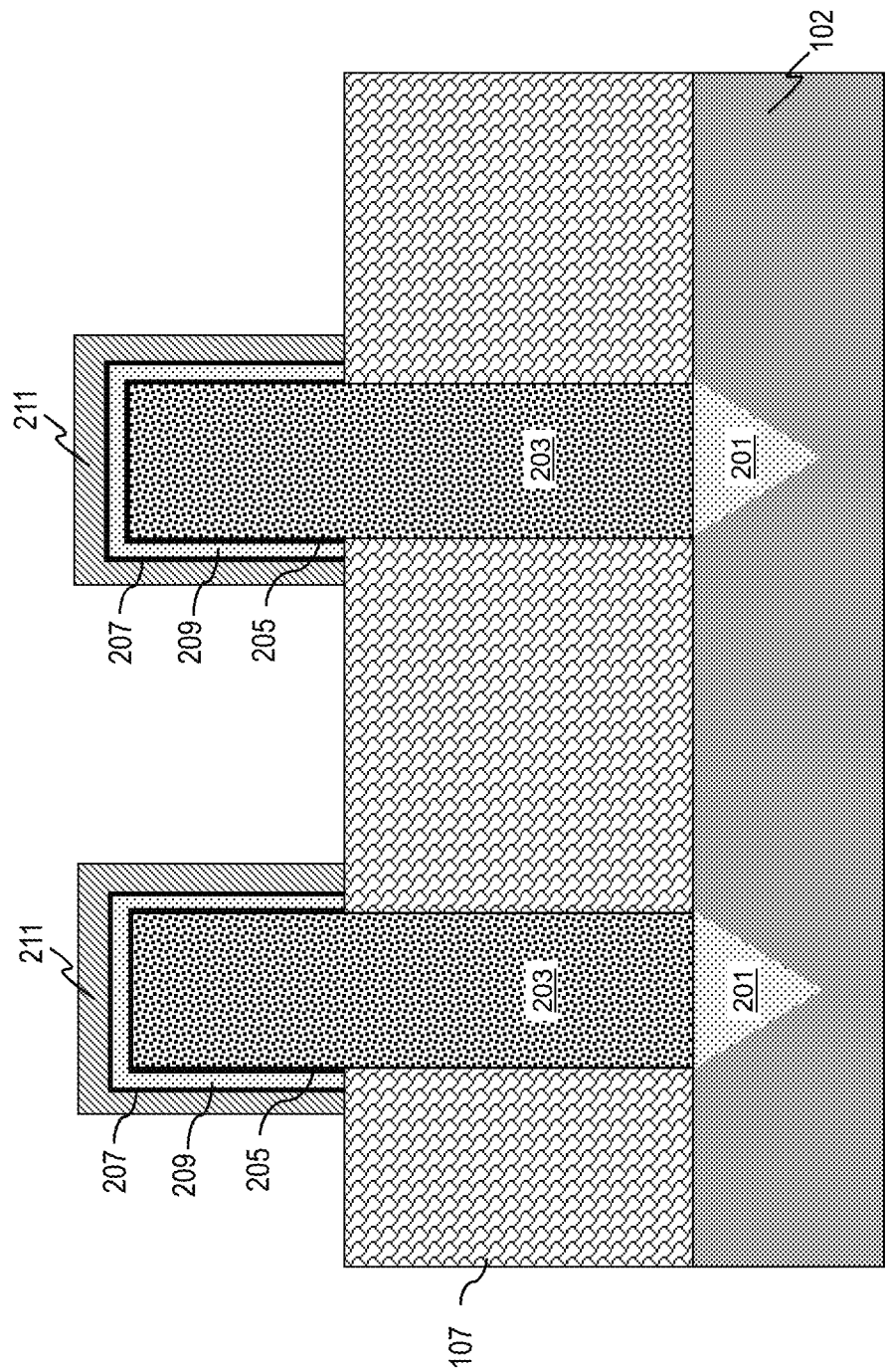
Figure 2H:
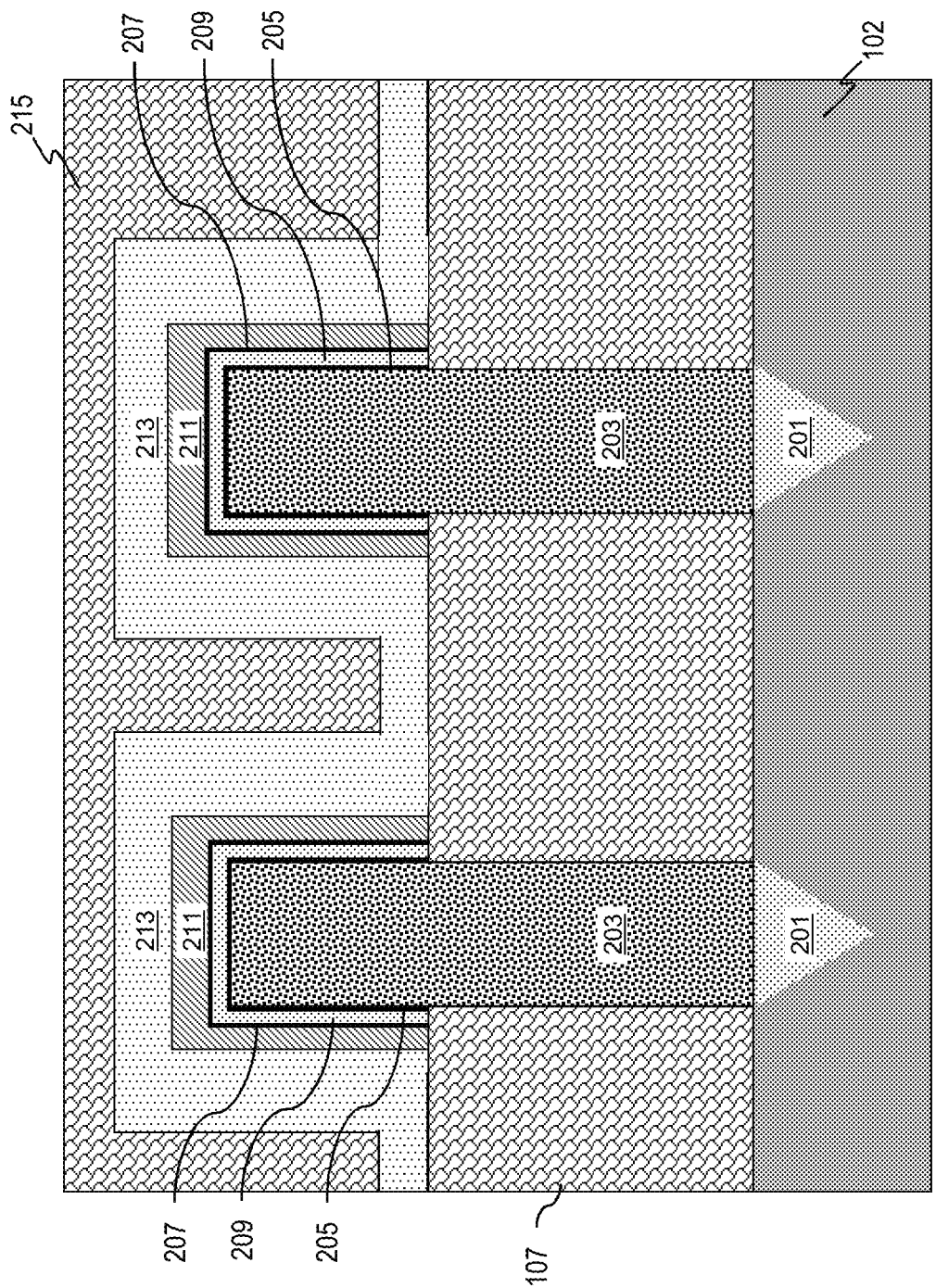

Adverting to FIG. 2G, an AlInGaP/InGaP MQW are formed of AlInGaP layers 205 and 207 and an InGaP layer 209 therebetween is formed over each n-InGaP pillars 203 above the oxide layer 107 by MOCVD. The AlInGaP layers 205 and 207 may be formed, e.g., to a thickness of 2 nm to 5 nm, and InGaP layer 209 is formed, e.g., to a thickness of 8 nm to 15 nm. A p-InGaP layer 211 is then formed, e.g., to a thickness of 100 nm to 250 nm, over each AlInGaP/InGaP MQW down to the oxide layer 107 by MOCVD. Next, a conformal electrically conductive metal or TCO layer 213 is formed, e.g., to a thickness of 100 nm to 250 nm, over the oxide layer 107 and the p-InGaP layer 211, as depicted in FIG. 2H. An oxide layer 215 is then formed over the electrically conductive metal or TCO layer 213.

Figure 2I:
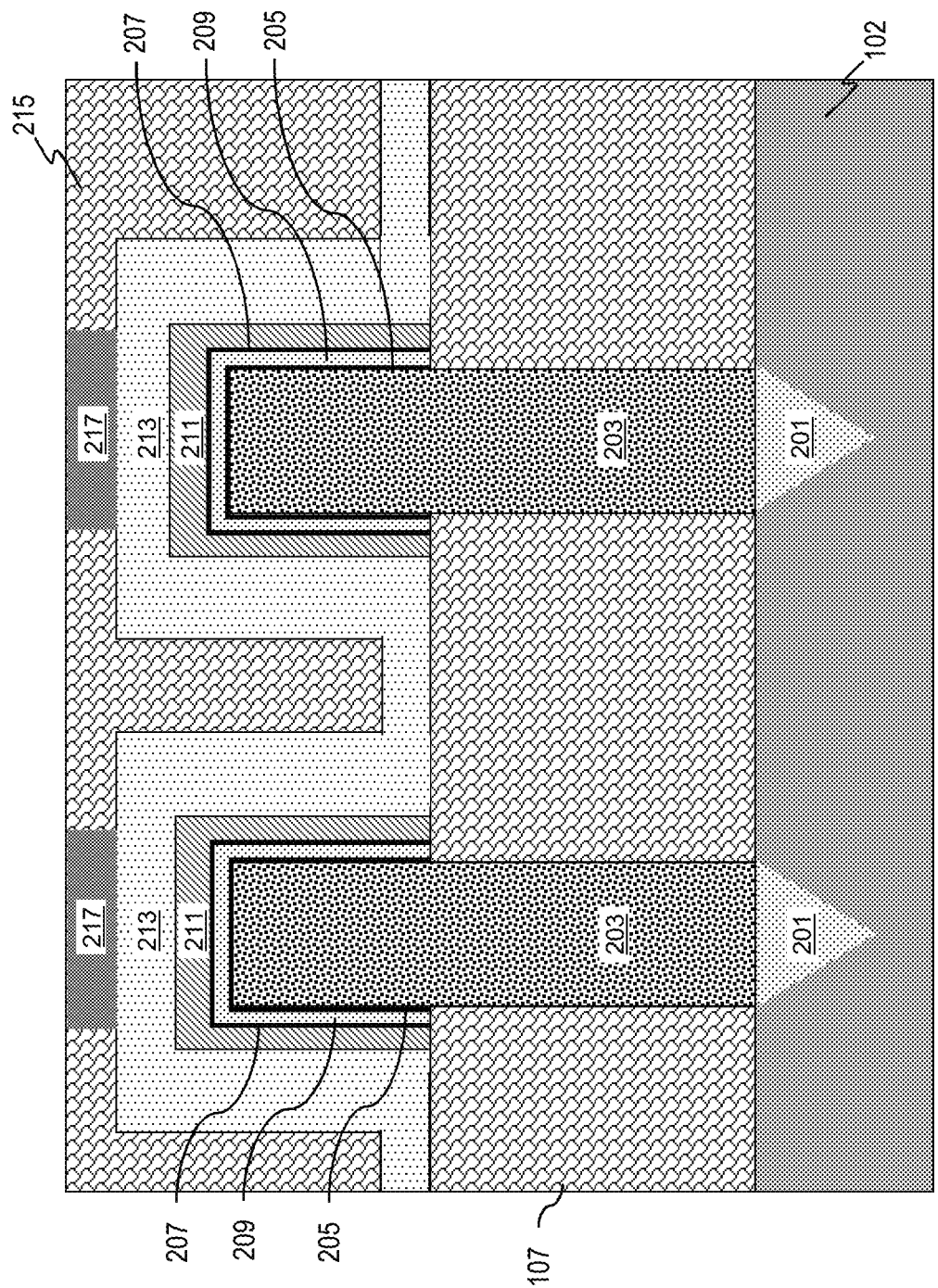
Figure 2J:
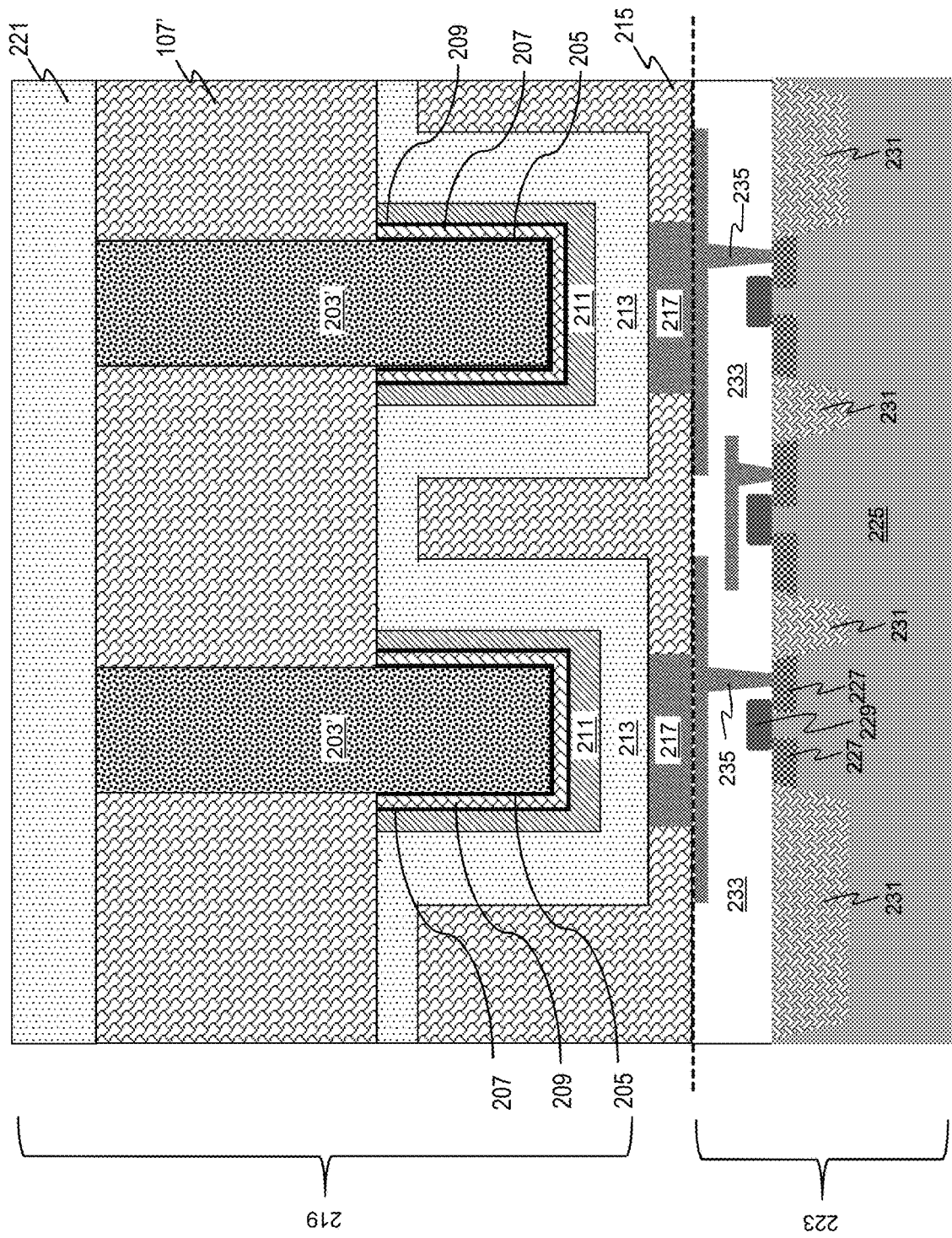

Next, trenches (not shown for illustrative convenience) are formed through the oxide layer 215 down to the electrically conductive metal or TCO layer 213 above each n-InGaP pillars 203 and the trenches are filled with metal, e.g., Ti, Al or Ni, and then planarized, e.g., by CMP, down to the oxide layer 215 forming metal pads 217, as depicted in FIG. 2I. As illustrated in FIG. 2J, structure 219 (LED wafer) is flipped and bonded to Si-CMOS wafer 223. Next, the Si substrate 102, the GaAs 201, and portions of the oxide layer 107 and n-InGaP pillars 203 are removed forming oxide layer 107' and n-InGaP pillars 203'. The remaining oxide layer 107' and n-InGaP pillars 203' have a thickness of at least 0.5 µm to 1 µm. The structure 219 is then flipped and a TCO layer 221 is formed over the structure 219. Next, each metal pads 217 is connected to a Si CMOS wafer 223 that includes a substrate 225, source/drain (S/D) regions 227, gates 229, STI structures 231, an oxide layer 233, and metal contacts 235. The CMOS wafer 223 applies bias to structure 219 and ground on the TCO layer 221 for lighting the red LEDs.

The embodiments of the present disclosure can achieve several technical effects including preventing bending of Si wafers; enabling the creation of Si nanowires of desirable diameters and replacement of the Si nanowires with GaN or InGaP selective area growth; avoiding the need for growing thick buffer layers; reducing epitaxial (epi) growth time and cost as well as minimizing lattice and CTE mismatch effects. Further, the nanowire GaN or InGaP pillars may be used to form LEDs, radio frequency (RF) and power devices at low cost while facilitating the smooth integration of Si CMOS and GaN or InGaP devices on the same wafer. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of semiconductor devices including semiconductor-based LEDs.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   a silicon (Si) complementary metal-oxide-semiconductor (CMOS) substrate having a plurality of metal contacts laterally separated;
   a metal pad electrically connected to each metal contact;
   an oxide structure over the Si CMOS substrate adjacent to and between each metal pad;
   a conformal first transparent conductive oxide (TCO) layer over the Si CMOS substrate and above each metal pad;
   a u-shaped p-type gallium nitride (p-GaN) layer disposed over the TCO layer;
   an indium gallium nitride (InGaN) and gallium nitride (GaN) multiple quantum well (InGaN/GaN MQW) along each sidewall of the p-GaN layer;

a n-type GaN pillar between the InGaN/GaN MQWs over the p-GaN layer, above each metal pad;

an oxide layer over the Si CMOS substrate; and a second TCO layer over the oxide layer and each n-GaN pillar.

2. The device according to claim 1, further comprising an InGaN/GaN MQW between the p-GaN layer and a bottom of the n-GaN pillar.

3. The device according to claim 1, wherein an upper surface of the first TCO layer, the p-GaN layer, and each InGaN/GaN MQW are coplanar.

4. The device according to claim 1, wherein the oxide layer comprises a thickness of at least 0.5 micrometer (μm) to 1 μm.

5. The device according to claim 1, wherein the n-GaN pillar comprises a hexagonal shape between the InGaN/GaN MQWs and a cylindrical shape within the oxide layer.

6. The device according to claim 1, wherein the n-GaN pillar comprises a blue or green light emitting diode (LED).

7. A device comprising:

a silicon (Si) complementary metal-oxide-semiconductor (CMOS) substrate having a plurality of metal contacts laterally separated;

a metal pad electrically connected to each metal contact;

an oxide structure over the Si CMOS substrate adjacent to and between each metal pad;

a conformal first transparent conductive oxide (TCO) layer over the Si CMOS substrate and above each metal pad;

a u-shaped p-type indium gallium phosphide (p-InGaP) layer disposed over the TCO layer;

an aluminum indium gallium phosphide (AlInGaP) and InGaP multiple quantum well (AlInGaP/InGap MQW) along each sidewall of the p-InGaP layer;

a n-type InGaP pillar between the AlInGaP/InGaP MQWs over the p-InGaP layer, above each metal pad;

an oxide layer over the Si CMOS substrate; and a second TCO layer over the second oxide layer and each n-InGaP pillar.

8. The device according to claim 7, further comprising an AlInGaP/InGaP MQW between the p-InGaP layer and a bottom of the n-InGaP pillar.

9. The device according to claim 7, wherein an upper surface of the first TCO layer, p-InGaP layer, and each AlInGaP/InGaP MQW are coplanar.

10. The device according to claim 7, wherein the oxide layer comprises a thickness of at least 0.5 micrometer (μm) to 1 μm.

11. The device according to claim 7, wherein the n-InGaP pillar comprises a hexagonal shape between the AlInGaP/InGaP MQWs and a cylindrical shape within the oxide layer.

12. The device according to claim 11, wherein the n-InGaP pillar comprises a cylindrical shape within the oxide layer.

13. The device according to claim 7, wherein the n-InGaP pillar comprises a red LED.

14. A device comprising:

a silicon (Si) substrate having a plurality of metal contacts laterally separated;

a metal pad electrically connected to each metal contact;

a conformal transparent conductive oxide (TCO) layer over the Si substrate and above each metal pad;

a u-shaped p-InGaP layer disposed over the TCO layer;

an indium gallium nitride (InGaN) and gallium nitride (GaN) multiple quantum well (InGaN/GaN MQW) along each sidewall of the p-InGaP layer; and a n-InGaP pillar between the InGaN/GaN MQWs over the GaN layer, above each metal pad.

15. The device according to claim 14, wherein the n-InGaP pillar comprises a hexagonal shape between the AlInGaP/InGaP MQWs.

16. The device according to claim 14, wherein the n-InGaP pillar comprises a red LED.

* * * * *